(12) United States Patent
Miyazaki

(10) Patent No.: US 11,328,770 B2
(45) Date of Patent: May 10, 2022

(54) SEMICONDUCTOR STORAGE DEVICE

(71) Applicant: Kioxia Corporation, Tokyo (JP)

(72) Inventor: Takayuki Miyazaki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/122,063

(22) Filed: Dec. 15, 2020

(65) Prior Publication Data

US 2021/0280243 A1    Sep. 9, 2021

(30) Foreign Application Priority Data

Mar. 6, 2020  (JP) .............................. JP2020-039097

(51) Int. Cl.
*G11C 11/00* (2006.01)
*G11C 13/00* (2006.01)

(52) U.S. Cl.
CPC ........ *G11C 13/0026* (2013.01); *G11C 13/003* (2013.01); *G11C 13/0004* (2013.01); *G11C 13/004* (2013.01); *G11C 13/0069* (2013.01)

(58) Field of Classification Search
CPC ............ G11C 13/0026; G11C 13/0004; G11C 13/0003; G11C 13/004
USPC ....................................................... 365/163
See application file for complete search history.

(56) References Cited

U.S. PATENT DOCUMENTS

| | | | |
|---|---|---|---|
| 8,391,047 B2 | 3/2013 | Maejima | |
| 8,605,485 B2 | 12/2013 | Kanno | |
| 9,196,362 B2 | 11/2015 | Siau | |
| 2013/0223140 A1* | 8/2013 | Sohn | ............... G11C 11/4096 365/158 |
| 2016/0260489 A1* | 9/2016 | Lee | ................... G11C 16/3427 |
| 2019/0286556 A1* | 9/2019 | You | ..................... G06F 12/0261 |

FOREIGN PATENT DOCUMENTS

| | | |
|---|---|---|
| JP | 4861444 B2 | 1/2012 |
| JP | 5404674 B2 | 2/2014 |

* cited by examiner

*Primary Examiner* — Vu A Le
(74) *Attorney, Agent, or Firm* — Foley & Lardner LLP

(57) ABSTRACT

A memory includes first-lines, second-lines, and memory cells. Third-lines are provided to respectively correspond to groups each comprising m (m≥2) lines of the first-lines. A first selector selects a certain one of the first-lines from the groups and to connect the selected first-lines to the third-lines corresponding to the groups. Fourth-lines correspond to the third-lines. A second selector selects one of the third-lines and to connect the fourth-line to the selected third-line. A third selector selects a certain one of the second-lines. A first driver applied a voltage to the fourth-line. A second driver is connected to the third selector. The first driver charges the third-line corresponding to the first-line selected from the groups via the fourth-line. The first and second selectors bring the selected first-line and the third-line corresponding the first-line to an electrically floating state. The second driver applies a voltage to the selected second-line.

24 Claims, 9 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2020-039097, filed on Mar. 6, 2020, the entire contents of which are incorporated herein by reference.

FIELD

The embodiments of the present invention relate to a semiconductor storage device.

BACKGROUND

Variable resistance elements used in a semiconductor storage device are elements that can electrically switch at least between two resistance values, for example, a high resistance state and a low resistance state. An initialization step (hereinafter, "forming") to form conductive paths in variable resistance elements is required to enable electrical switching of the resistance states of the variable resistance elements. The forming is performed by applying a voltage to between an upper electrode (a bit line) of a selected one of the variable resistance elements and a lower electrode (a word line) thereof.

However, if forming of the variable resistance elements is performed one by one (one bit per one bit), the forming takes a long time. On the other hand, if forming of a plurality of variable resistance elements (a plurality of bits) is simultaneously performed, a voltage is kept applied to the variable resistance elements and therefore stress of the voltage is continuously placed on variable resistance elements where the forming has been already completed.

DETAILED DESCRIPTION

Figure 1:
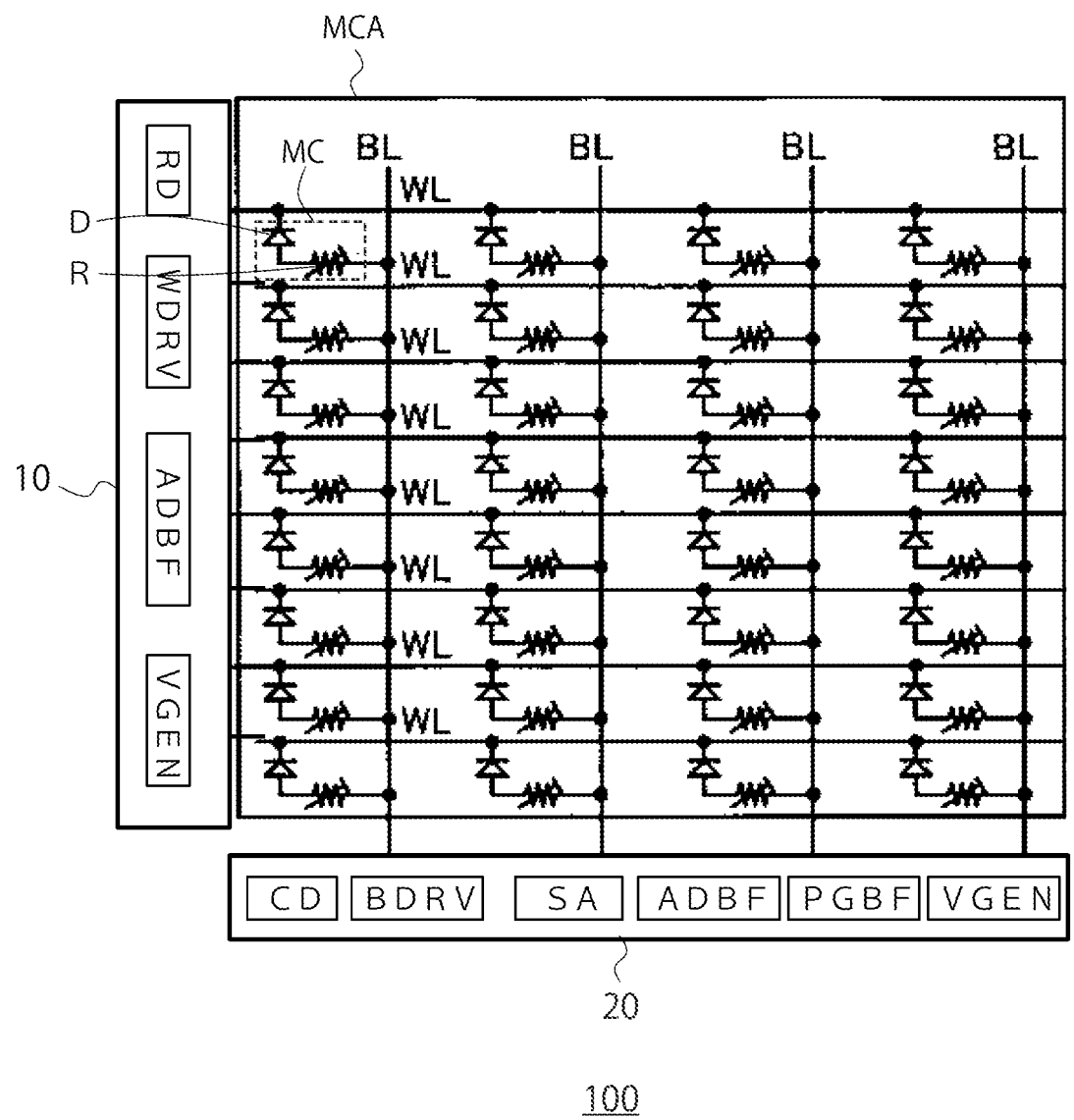
FIG. 1 is a diagram illustrating a configuration example of a non-volatile semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according to the present embodiment includes a plurality of first lines, a plurality of second lines, and a plurality of memory cells respectively connected between the first lines and the second lines. A plurality of third lines are provided to respectively correspond to groups each comprising m (m≥2) lines of the first lines. A first selection circuit is configured to select a certain one of the first lines from each of the groups and to connect the selected first lines to the third lines corresponding to the groups, respectively. At least one fourth line is provided to correspond to the third lines. A second selection circuit is configured to select a certain one of the third lines and to connect the fourth line to the selected third lines. A third selection circuit is configured to select a certain one of the second lines. A first driver is configured to apply a voltage to the fourth line. A second driver is connected to the third selection circuit. The first driver charges the third line corresponding to the first line selected from at least one of the groups via the fourth line. The first and second selection circuits bring the selected first line and the third line corresponding the first line to an electrically floating state. The second driver applies a voltage to the selected second line.

First Embodiment

FIG. 1 is a diagram illustrating a configuration example of a non-volatile semiconductor storage device according to a first embodiment. A non-volatile semiconductor storage device 100 (hereinafter, simply "storage device 100") can be, for example, any of a resistance-change random access memory (a ReRAM (Resistance Random Access Memory)), a phase-change random access memory (a PRAM (Phase-Change RAM) or a PCM (Phase-Change Memory)), an interfacial phase-change random access memory (an iPCM (Interfacial PCM)), and a current sensing memory such as a FeRAM (Ferroelectric random access memory) or an MRAM (Magnetic RAM). The storage device 100 has a memory cell array MCA, and control circuits 10 and 20 as peripheral circuits.

The memory cell array MCA is configured by two-dimensionally or three-dimensionally arranging a plurality of memory cells MC that store data therein. The memory cell array MCA has a plurality of word lines WL, and a plurality of bit lines BL. The word lines WL and the bit lines BL intersect with each other and are, for example, substantially orthogonal to each other in a planar layout. Memory cells MC are provided to respectively correspond to intersections between the word lines WL and the bit lines BL and are each connected between a corresponding one of the word lines WL and a corresponding one of the bit lines BL. Therefore, the memory cell array MCA is a so-called "cross-point memory cell array". The number of the word lines WL, the number of the bit lines BL, and the number of the memory cells MC are not particularly limited to any specific number.

Each of the memory cells MC includes a resistance element R and a non-linear element such as a diode D. The resistance element R and the diode D are connected in series between the corresponding bit line BL and the corresponding word line WL. The resistance element R is electrically rewritable and can store data in a non-volatile manner on the basis of a resistance value. The diode D is placed to electrically access a selected cell (to perform forming/writing/erasing/reading). The diode D is provided to prevent a sneak current at the time of an access to a selected cell. One end of the resistance element R is connected to the corresponding bit line BL and the other end of the resistance element R is connected to one end (an anode) of the diode D. The other end (a cathode) of the diode D is connected to the corresponding word line WL. The diode D may be connected in the opposite direction in the memory cell MC. The resistance element R and the diode D may be arranged in the opposite relation in the memory cell MC. The memory cells MC can be unipolar memory cells or bipolar memory cells. Each of the memory cells MC may include a two-terminal switching part other than the diode D. The two-terminal switching part may have following characteristics. For example, the two-terminal switching part is in a high resistance state, for example, an electrically non-conducting state when a voltage applied between the two terminals is equal to or lower than a threshold, while the two-terminal switching part changes to a low resistance state, for example, an electrically conducting state when a voltage applied between the two terminals is above the threshold. When a current equal to or higher than a holding current value continues to flow in the two-terminal switching part in an on-state, the two-terminal switching part keeps the on-state. The two-terminal switching part may have this function regardless of the polarity of the voltage.

The resistance element R transitions from the high resistance state to the low resistance state (a set state), for example, when a predetermined set voltage is applied to both ends of the memory cell MC in the forward direction of the diode D. The resistance element R transitions from the low resistance state to the high resistance state (a reset state), for example, when a predetermined reset voltage is applied to the both ends of the memory cell MC in the forward direction of the diode D. For example, in a case in which the memory cells MC are PCMs or iPCMs, the phase change film of each of the memory cells MC causes phase transition and the resistance element R being a PCM element or an iPCM element is accordingly brought to the low resistance state (the set state) or the high resistance state (the reset state) when a current is passed through the memory cells MC. This enables the memory cells MC to store logical data therein. For example, when the low resistance state (the set state) is data "0" and the high resistance state (the reset state) is data "1", each of the memory cells MC can store at least one-bit data ("0" or "1") therein. As described above, the resistance element R is an element that is capable of transitioning at least between states of two resistance values.

However, memory cells MC immediately after manufacturing do not allow a current required to bring each of the memory cells MC to the set state or the reset state to pass through with voltages used in the normal operation because an insulating film and the like (not illustrated) located in a current path serve as a barrier. Therefore, forming processing is performed in a test process after the manufacturing to enable each of the memory cells MC to transition to the set state and the reset state, that is, to bring each of the memory cells MC to a state in which the resistance value is electrically controllable. The forming processing is an initialization process in which voltage pulses having predetermined magnitude and duration are applied to the memory cells MC to pass a current through each of the memory cells MC, thereby enabling data to be written into the memory cells MC.

The control circuits 10 and 20 control the memory cell array MCA. The control circuit 10 includes a row decoder RD, a word line driver WDRV, an address buffer ADBF, a voltage generation circuit VGEN, and the like. The control circuit 20 includes a column decoder CD, a bit line driver BDRV, a sense amplifier SA, an address buffer ADBF, a page buffer PGBF, a voltage generation circuit VGEN, and the like.

The address buffers ADBF receive from outside an address signal of a word line WL or a bit line BL to be selected and temporarily retain the address signal at the time of forming/reading/erasing. The address buffers ADBF supply the address signal to the row decoder RD or the column decoder CD.

The row decoder RD decodes the address signal and selects a certain word line WL from the word lines WL according to the address signal. The word line driver WDRV applies a predetermined voltage to the selected word line WL via the row decoder RD to enable an operation of forming/reading/writing/erasing.

The column decoder CD decodes the address signal and selects a bit line BL according to the address signal. The bit line driver BDRV applies a predetermined voltage to the selected bit line BL to enable an operation of forming/reading/writing/erasing. The sense amplifier SA detects data read from the selected bit line BL and transfers the read data to the page buffer PGBF. The page buffer PGBF temporarily retains (latches) data to be written into the selected bit line BL or data read from the selected bit line BL.

The voltage generation circuits VGEN of the control circuits 10 and 20 are step-up circuits or step-down circuits that generate various voltages from external power to be applied to the selected word line WL and the selected bit line BL, respectively.

With this configuration, the control circuits 10 and 20 can select a certain word line WL and a certain bit line BL and apply various voltages thereto. As a result, a forming/reading/writing/erasing operation can be performed to a memory cell MC (a selected cell) connected between the selected word line WL and the selected bit line BL.

Figure 2:
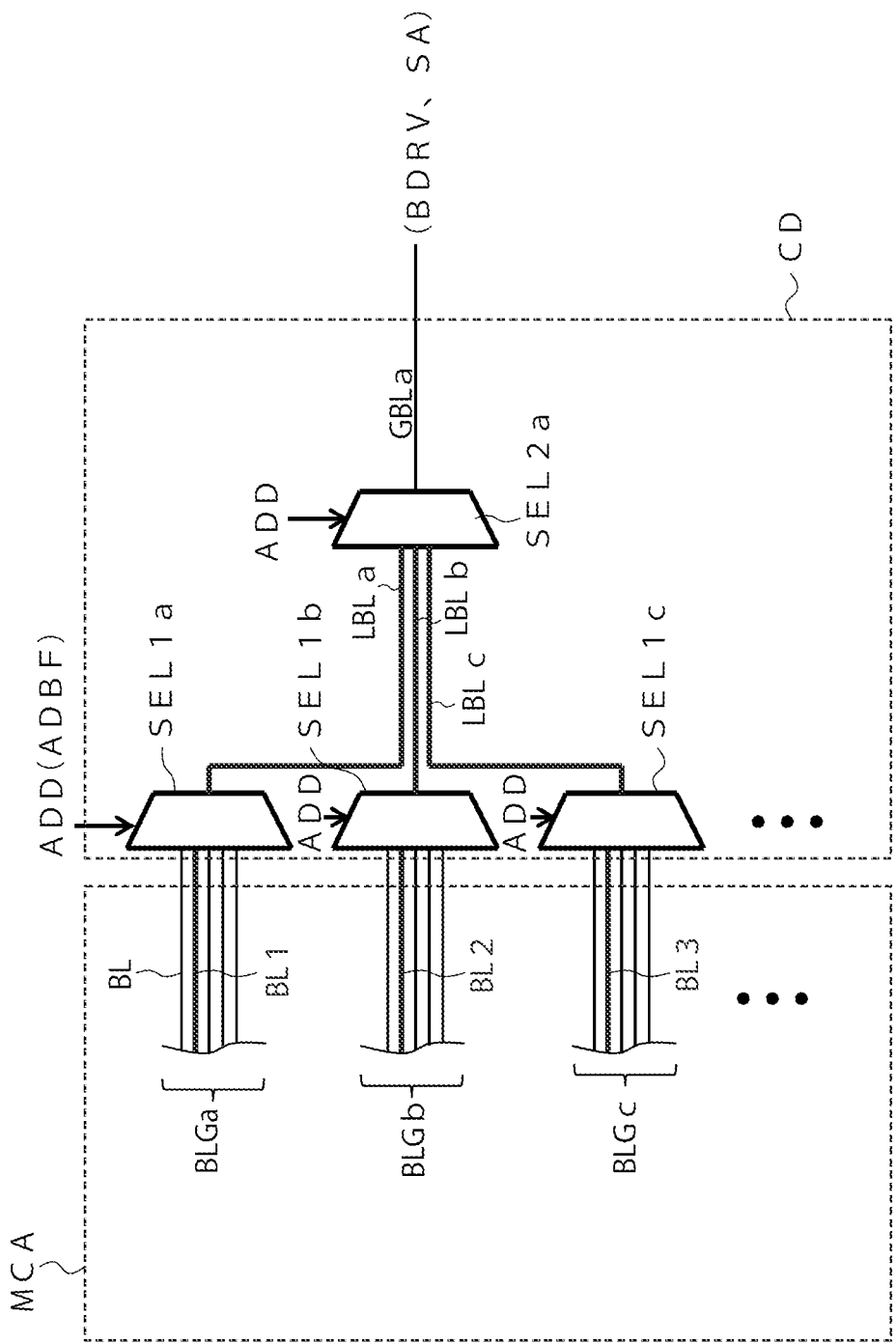
FIG. 2 is a block diagram illustrating a configuration example of a column decoder according to the first embodiment.

FIG. 2 is a block diagram illustrating a configuration example of the column decoder according to the first embodiment. The column decoder CD is configured to apply a predetermined voltage from the bit line driver BDRV to the selected bit line BL according to an address signal ADD from the address buffer ADBF. More specifically, the column decoder CD includes a plurality of selection circuits SEL1a to SEL1c, at least one selection circuit SEL2a, a plurality of local bit lines LBL, and at least one global bit line GBL.

The selection circuits SEL1a to SEL1c are provided to respectively correspond to groups BLGa to BLGc each including m (m is an integer equal to or larger than 2) bit lines BL. The selection circuits SEL1a to SEL1c are each configured to select a certain bit line BL from a corresponding one of the groups BLGa to BLGc and connect the selected bit line BL to a corresponding one of the local bit lines LBL. The local bit lines LBLa to LBLc are provided to correspond to the groups BLGa to BLGc each including the m bit lines BL and are provided to correspond to the selection circuits SEL1a to SEL1c, respectively. That is, the selection circuits SEL1a to SEL1c and the local bit lines LBLa to LBLc are provided to be same in the number, which corresponds to the number of the groups BLGa to BLGc of the bit lines BL. While m is 5 in FIG. 2, the number is not limited thereto. The number of the groups BLGa to BLGc of the bit lines BL, the number of the selection circuits SEL1a to SEL1c, and the number of the local bit lines LBLa to LBLc are not limited to three and may be less or more.

The selection circuits SEL1a to SEL1c are switching circuits each being constituted of a transistor or the like. For example, the selection circuits SEL1a to SEL1c each select one bit line BL from the corresponding one of the groups BGL1a to BLG1c according to the address signal ADD and connect the selected bit line BL to the corresponding one of the local bit lines LBLa to LBLc.

The selection circuit SEL2a is provided to correspond to the local bit lines LBLa to LBLc and is configured to select a certain local bit line from the local bit lines LBLa to LBLc and connect the selected local bit line to a global bit line GBLa. The global bit line GBLa is provided to correspond to the local bit lines LBLa to LBLc and is provided to correspond to the selection circuit SEL2a. That is, the selection circuit SEL2a and the global bit line GBLa are provided to be same in the number. In FIG. 2, only one selection circuit SEL2a and one global bit line GBLa are provided. However, the number of the selection circuit SEL2a and the number of the global bit line GBLa are not limited thereto. The number of the local bit lines corresponding to the selection circuit SEL2a and the global bit line GBLa is not limited to three and may be less or more.

The selection circuit SEL2a is a switching circuit constituted of a transistor or the like. For example, the selection circuit SEL2a selects one or a plurality of local bit lines from the local bit lines LBLa to LBLc according to the address signal ADD and connects the selected local bit line(s) to the corresponding global bit line GBLa.

The global bit line GBLa is connected to the bit line driver BDRV and the sense amplifier SA and supplies a predetermined voltage from the bit line driver BDRV to the side of the bit lines BL or transmits data read from the bit lines BL to the sense amplifier SA. The bit line driver BDRV applies a voltage to the selected bit lines BL via the global bit line GBLa, the selection circuit SEL2a, the local bit lines LBLa to LBLc, and the selection circuits SEL1a to SEL1c.

The selection circuit SEL1a to SEL1c each select one bit line BL from the corresponding one of the groups BLGa to BLGc of the bit lines BL and connect the selected bit line BL to the corresponding one of the local bit lines LBLa to LBLc. That is, the selected bit line BL selected from each of the groups BLGa to BLGc is one bit line. Meanwhile, the selection circuit SEL2a is configured to be capable of selecting one or a plurality of local bit lines from the local bit lines LBLa to LBLc and connecting the selected local bit line(s) to the global bit line GBLa. Therefore, the global bit line GBLa also can be simultaneously connected to all the local bit lines LBLa to LBLc to supply a predetermined voltage to the local bit lines LBLa to LBLc.

Forming processing performed by the storage device 100 according to the present embodiment is explained next.

Figure 3:
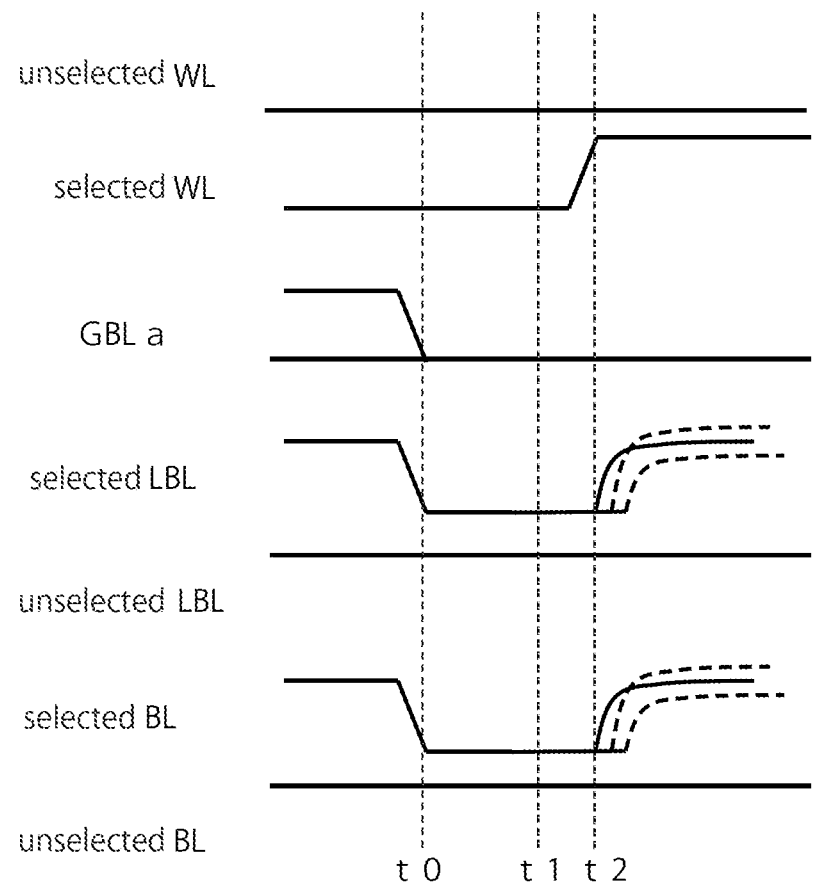
FIG. 3 is a timing chart illustrating an example of forming processing according to the first embodiment.

FIG. 3 is a timing chart illustrating an example of the forming processing according to the first embodiment. It suffices to perform the forming processing in an inspection process before shipment after manufacturing of the storage device 100. In the present embodiment, unselected bit lines BL are at a high level and selected bit lines BL are charged to a low level at the time of precharging.

First, the word lines WL, the bit lines BL, the local bit lines LBLa to LBLc, and the global bit line GBLa are all set in an unselected state before a time t0.

Next, in a period from the time t0 to a time t1, selected bit lines BL are precharged.

At the time t0, the selection circuits SEL1a to SEL1c in FIG. 2 each select one bit line BL from the corresponding one of the groups BLGa to BLGc and connect the selected bit line BL to the corresponding one of the local bit lines LBLa to LBLc. The selection circuit SEL2a connects the local bit lines LBLa to LBLc in common to the global bit line GBLa.

A timing when the selection circuits SEL1a to SEL1c connect the selected bit lines BL to the corresponding local bit lines LBLa to LBLc can be either before or after a timing when the selection circuit SEL2a connects the local bit lines LBLa to LBLc to the global bit line GBLa. That is, the timing of connection between the selected bit lines BL and the local bit lines LBLa to LBLc can be either before or after a timing when a precharge voltage is applied to the local bit lines LBLa to LBLc. In a case in which the selection circuits SEL1a to SEL1c perform the switching operation before the selection circuit SEL2a, the local bit lines LBLa to LBLc and the selected bit lines BL are simultaneously precharged when the selection circuit SEL2a performs the switching operation. In a case in which the selection circuit SEL2a performs the switching operation before the selection circuits SEL1a to SEL1c, the local bit lines LBLa to LBLc are precharged when the selection circuit SEL2a performs the switching operation and then the selected bit lines BL are precharged when the selection circuits SEL1a to SEL1c perform the switching operation.

At the time t0, the bit line driver BDRV activates the global bit line GBLa to a low level to charge the local bit lines LBLa to LBLc to a low level. Along therewith, the bit line driver BDRV also charges the selected bit lines BL respectively connected to the local bit lines LBLa to LBLc to a low level. The unselected bit lines BL are kept at the high level.

Next, at the time t1, the selection circuit SEL2a electrically disconnects the global bit line GBLa from the local bit lines LBLa to LBLc. At this time, the selection circuits SEL1a to SEL1c have respectively connected the selected bit lines BL and the corresponding local bit lines LBLa to LBLc to each other. Accordingly, the selection circuits SEL1a to SEL1c and SEL2a bring the selected bit lines BL and the corresponding local bit lines LBLa to LBLc to an electrically floating state. At this time, the selected bit lines BL and the local bit lines LBLa to LBLc have been charged and are brought to the floating state where charges (for example, electrons) are sufficiently held. The global bit line GBLa may keep the voltage or may transit to a different voltage (for example, a voltage of the unselected bit lines BL) after disconnected from the local bit lines by the selection circuit SEL2a.

Next, at a time t2, the word line driver WDRV applies a voltage to a selected word line WL. For example, the row decoder RD selects one word line WL from the word lines WL and the word line driver WDRV applies a predetermined voltage (a high level) to the selected word line WL. Accordingly, a voltage difference (a forming voltage) between the selected word line WL and the selected bit lines BL is applied to a plurality of selected memory cells MC connected between the selected word line WL and the selected bit lines BL. The high level of the selected word line WL and the high level of the selected bit lines BL do not always need to be a same voltage. Moreover, either the low level of the selected word line WL or the high level of the selected bit lines BL can be higher. Similarly, either the high level of the selected word line WL or the low level of the selected bit lines BL can be higher.

In the forming processing, a voltage lower than the voltage difference between the selected word line WL and the selected bit lines BL is applied to unselected memory cells MC connected to unselected word lines WL and the unselected bit lines BL. A large current is prevented from flowing in any of unselected memory cells MC connected to the unselected word lines WL and the unselected bit lines BL, unselected memory cells MC connected to the unselected word lines WL and the selected bit lines BL, and unselected memory cells MC connected to the selected word line WL and the unselected bit lines BL. For example, it suffices that the voltage of the unselected word lines WL and the voltage of the unselected bit lines BL are set to half the difference between the selected bit line voltage and the selected word line voltage, or less. In a case in which a selector of the memory cells MC is an element that passes a current when the voltage is a threshold voltage or higher, a voltage equal to or higher than the threshold voltage is applied to the selected memory cells MC and a voltage lower than the threshold voltage is applied to the other unselected memory cells MC.

The forming voltage can be higher than the voltages used in the normal operation, although not particularly limited to any specific voltage. For example, the forming voltage is about 5 volts (V). Since a memory cell MC before subjected to forming is in an insulted state, only a current of, for example, about 10 nanoamperes (nA) flows therein. However, the resistance of a memory cell MC is lowered and a current of, for example, about several microamperes (µA) can pass therethrough when the forming processing has been performed. That is, the forming processing enables a memory cell MC to be brought to a set state or a reset state and to store data therein.

When a memory cell MC is enabled by the forming processing to pass a current of a predetermined value or higher, the forming processing of that memory cell MC is completed. Time points of completion of the forming processing of memory cells MC differ according to the memory cells MC.

When memory cells MC pass a current, charges get out of the selected bit lines BL and the local bit lines LBLa to LBLc in the floating state. Accordingly, the selected bit lines BL and the local bit lines LBLa to LBLc rise from the low level to a high level. The rising timings of the selected bit lines BL and the local bit lines LBLa to LBLc differ according to the memory cells MC.

The end of the forming processing may be a time point when the selected bit lines BL and the local bit lines LBLa to LBLc has risen to a predetermined value. That is, the forming processing may be ended by passing the amounts of charges accumulated in the selected bit lines BL and the local bit lines LBLa to LBLc to the corresponding memory cells MC.

Alternatively, data is written into the memory cells MC or data is read from the memory cells MC after the charge amounts are passed to the corresponding memory cells MC. The forming processing may be ended by verifying that data has been normally stored in the memory cells MC. In this case, the forming processing from the time t0 to the time t2 is performed again to memory cells MC that do not have data normally stored therein. The forming processing may be ended when the forming processing and the data write/read operation have been thus repeated and a predetermined number of or more memory cells MC have normally stored data.

As described above, according to the present embodiment, the selected bit lines BL and the corresponding local bit lines LBLa to LBLc are charged and are thereafter brought to the electrically floating state while being connected to a BL in one of corresponding BLGa, BLGb or BLGc during the forming processing. The charges accumulated in the selected bit lines BL and the local bit lines LBLa to LBLc are passed to the selected memory cells MC and are used in the forming processing. Accordingly, the current flowing in the selected memory cells MC is restricted to the amount of charges accumulated in the selected bit lines BL and the local bit lines LBLa to LBLc. Therefore, application of excessive voltage stress to specific memory cells MC is prevented.

Further, in the present embodiment, a current is passed through the memory cells MC in the state in which the selected bit lines BL and the corresponding local bit lines LBLa to LBLc are connected to each other. That is, the charges accumulated in the total capacity of a selected bit line BL and the local bit line (any of LBLa to LBLc) flow in the memory cells MC. Therefore, a current of a capacity larger than the capacity of only a selected bit line BL flows in the memory cells MC. This enables the forming processing to be performed in a short time and with a reliability.

Further, because the charges precharged in the selected bit lines BL and the local bit lines LBLa to LBLc are used in the forming processing in the present embodiment, the bit line driver BDRV does not need to supply a larger current at one time even if a plurality of memory cells MC are simultaneously subjected to the forming.

For example, in a case in which the bit line driver BDRV directly supplies a current to a plurality of memory cells MC at the same time in the forming processing, the bit line driver BDRV needs to supply a large current. To address this issue, it is necessary to increase the current drive capability of the bit line driver BDRV or perform the forming of the memory cells MC in small numbers. In this case, the circuit scale is increased or the forming processing takes a longer time.

In contrast thereto, in the present embodiment, the bit line driver BDRV previously charges (precharges) a plurality of bit lines BL respectively selected from the groups BLGa to BLGc via the corresponding local bit lines LBLa to LBLc before the forming processing. The selection circuits SEL1a to SEL1c and SEL2a bring the selected bit lines BL and the corresponding local bit lines LBLa to LBLc to the electrically floating state while the selected bit lines BL and the corresponding local bit lines LBLa to LBLc are connected to each other. Thereafter, the bit line driver BDRV does not need to supply a current to the memory cells MC in the forming processing and the precharged selected bit lines BL and local bit lines LBLa to LBLc supply a current to the memory cells MC at the same time. This enables the selection circuits SEL1a to SEL1c to select as many memory cells MC as the local bit lines LBLa to LBLc and to simultaneously perform forming of the selected memory cells MC. As a result, the forming of many memory cells MC can be performed in a short time in the present embodiment with no load applied to the bit line driver BDRV.

The selected bit lines BL and the corresponding local bit lines LBLa to LBLc may supply a current to the memory cells MC one by one in turns at the time of the forming processing. In this case, it suffices that the selection circuits SEL1a to SEL1c connect the selected bit lines BL and the corresponding local bit lines LBLa to LBLc to each other in turns and repeat the precharging and the forming processing. In this case, the forming processing of the memory cells MC can be sequentially performed while a longer time is required.

Second Embodiment

Figure 4:
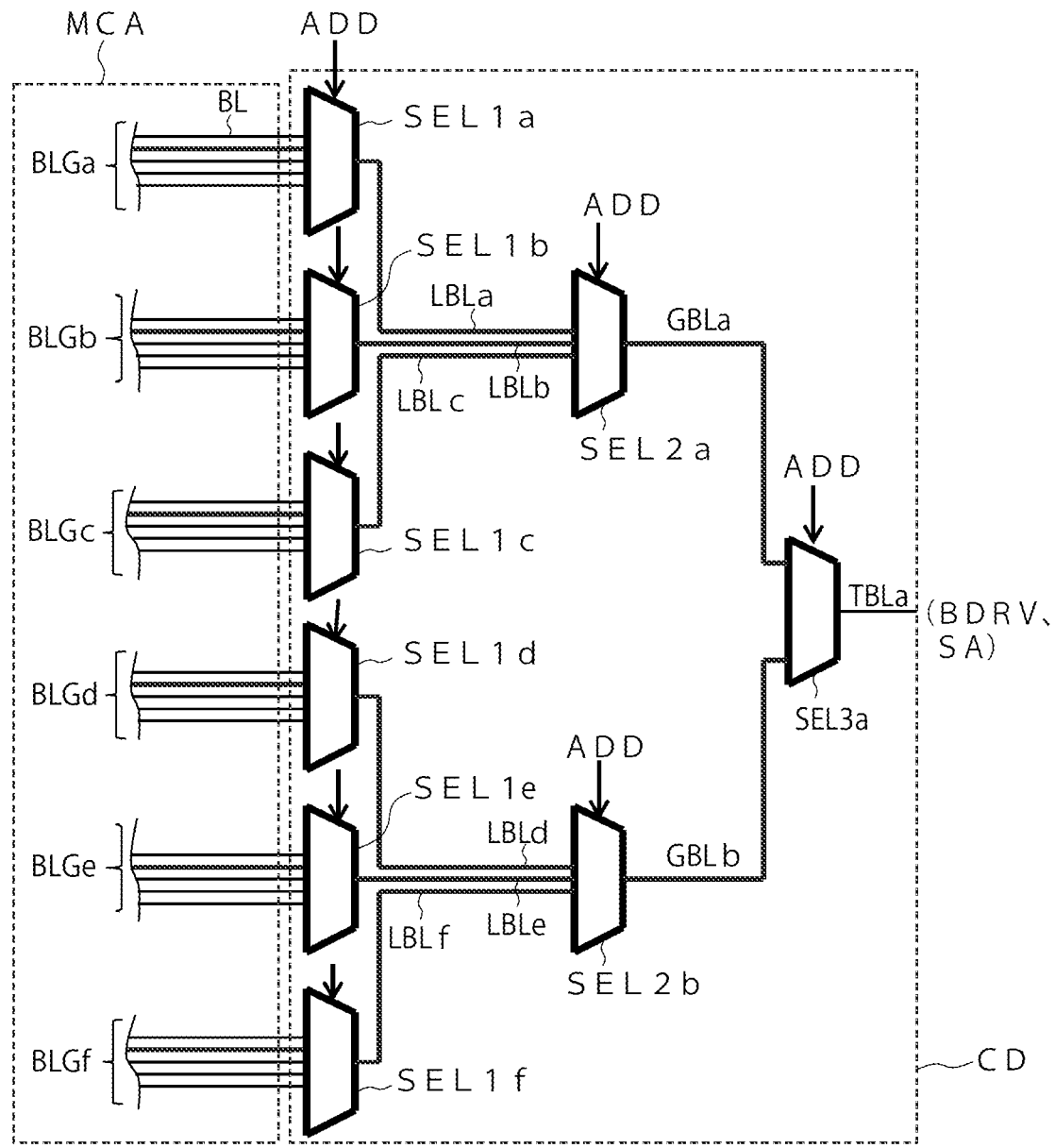
FIG. 4 is a block diagram illustrating a configuration example of a column decoder according to a second embodiment.

FIG. 4 is a block diagram illustrating a configuration example of a column decoder according to a second embodiment. The column decoder CD according to the second embodiment has selection circuits hierarchized in three layers, and the bit lines are hierarchized in four layers. The column decoder CD includes the selection circuits SEL1a to SEL1c and selection circuits SEL1d to SEL1f provided between the bit lines BL and the local bit lines LBLa to LBLc and local bit lines LBLd to LBLf, respectively, the selection circuit SEL2a and a selection circuit SEL2b provided between the local bit lines LBLa to LBLf and the global bit line GBLa and a global bit line GBLb, respectively, and a selection circuit SEL3a provided between the global bit lines GBLa and GBLb and a top global bit line TBLa.

The selection circuits SEL1a to SEL1f are provided to correspond to the groups BLGa to BLGc and groups BLGd to BLGf of the bit lines BL, respectively, and each select a certain bit line BL from a corresponding one of the groups BLGa to BLGf to connect the selected bit line BL to a corresponding one of the local bit lines LBLa to LBLf.

The selection circuit SEL2a is provided to correspond to the local bit lines LBLa to LBLc and selects a certain local bit line from the local bit lines LBLa to LBLc to connect the selected local bit line to the global bit line GBLa. The selection circuit SEL2b is provided to correspond to the local bit lines LBLd to LBLf and selects a certain local bit line from the local bit lines LBLd to LBLf to connect the selected local bit line to the global bit line GBLb.

Further, the selection circuit SEL3a is provided to correspond to the global bit lines GBLa and GBLb and selects a certain global bit line from the global bit lines GBLa and GBLb to connect the selected global bit line to the top global bit line TBLa.

As described above, the selection circuits are hierarchized in three layers and the bit lines are hierarchized in four layers in the second embodiment. While being provided to correspond to three local bit lines, each of the selection circuits SEL2a and SEL2b may correspond to less or more local bit lines. While being provided to correspond to the two global bit lines GBLa and GBLb, the selection circuit SEL3a may correspond to less or more global bit lines.

The selection circuits SEL2b and SEL3a are also switching circuits each constituted of a transistor or the like. For example, the selection circuit SEL2b selects one local bit line from the local bit lines LBLd to LBLf according to the address signal ADD and connects the selected local bit line to the corresponding global bit line GBLb. For example, the selection circuit SEL3a selects one global bit line from the global bit lines GBLa and GBLb according to the address signal ADD and connects the selected global bit line to the corresponding top global bit line TBLa.

The top global bit line TBLa is connected to the bit line driver BDRV and the sense amplifier SA and supplies a predetermined voltage from the bit line driver BDRV to the side of the bit lines BL or transmits data read from the bit lines BL to the sense amplifier SA. The bit line driver BDRV applies a voltage to the selected bit lines BL via the top global bit line TBLa, the selection circuit SEL3a, the global bit lines GBLa and GBLb, the selection circuits SEL2a and SEL2b, the local bit lines LBLa to LBLf, and the selection circuits SEL1a to SEL1f.

The selection circuits SEL1a to SEL1f each select one bit line BL from the corresponding one of the groups BLGa to BLGf of the bit lines BL and connect the selected bit line BL to the corresponding one of the local bit lines LBLa to LBLf. Meanwhile, the selection circuit SEL2a is configured to be capable of selecting one or a plurality of local bit lines from the local bit lines LBLa to LBLc and connecting the selected local bit line(s) to the global bit line GBLa. Therefore, the global bit line GBLa can also be simultaneously connected to all the local bit lines LBLa to LBLc to supply a predetermined voltage thereto. The selection circuit SEL2b is configured to be capable of selecting one or a plurality of local bit lines from the local bit lines LBLd to LBLf and connecting the selected local bit line(s) to the global bit line GBLb. Therefore, the global bit line GBLb can also be simultaneously connected to all the local bit lines LBLd to LBLf to supply a predetermined voltage thereto.

Further, the selection circuit SEL3a is configured to be capable of selecting one or a plurality of global bit lines from the global bit lines GBLa and GBLb and connecting the selected global bit line(s) to the top global bit line TBLa. Therefore, the top global bit line TBLa can also be simultaneously connected to all the global bit lines GBLa and GBLb and the local bit lines LBLa to LBLf to supply a predetermined voltage thereto.

In the second embodiment, the selection circuits SEL1a to SEL1f each select one bit line BL from the corresponding one of the groups BLGa to BLGf and connect the selected bit line BL to the corresponding one of the local bit lines LBLa to LBLf at the time of precharging. The selection circuits SEL2a and SEL2b connect the local bit lines LBLa to LBLc and LBLd to LBLf in common to the global bit lines GBLa and GBLb, respectively. Further, the selection circuit SEL3a connects the global bit lines GBLa and GBLb in common to the top global bit line TBLa.

Accordingly, the bit line driver BDRV charges the top global bit line TBLa, the global bit lines GBLa and GBLb, and the local bit lines LBLa to LBLf to a low level. Along therewith, the bit line driver BDRV charges the selected bit lines BL to a low level via the top global bit line TBLa, the global bit lines GBLa and GBLb, and the local bit lines LBLa to LBLf connected thereto, respectively. Unselected bit lines BL are kept at the high level.

At the time of the forming processing, the selection circuit SEL3a electrically disconnects the top global bit line TBLa from the global bit lines GBLa and GBLb. At this time, the selection circuits SEL1a to SEL1f, SEL2a, and SEL2b keep the selected bit lines BL, the corresponding local bit lines LBLa to LBLf, and the corresponding global bit lines GBLa and GBLb connected to each other. Accordingly, the selection circuits SEL1a to SEL1f, SEL2a, SEL2b, and SEL3a bring the selected bit lines BL, the corresponding local bit lines LBLa to LBLf, and the corresponding global bit lines GBLa and GBLb to the electrically floating state.

The selected bit lines BL, the corresponding local bit lines LBLa to LBLf, and the corresponding global bit lines GBLa and GBLb pass charges accumulated therein to the selected memory cells MC to perform forming of the memory cells MC. Accordingly, a current flowing in the selected memory cells MC is restricted to an amount of charges accumulated in the selected bit lines BL, the local bit lines LBLa to LBLf, and the global bit lines GBLa and GBLb.

Further, the current flowing in each of the selected memory cells MC has an amount of charges accumulated in the total capacity of the corresponding one of the selected bit lines BL, the corresponding one of the local bit lines LBLa to LBLf, and the global bit line GBLa or GBLb. The amount of charges accumulated in the global bit line GBLa is added to the local bit lines LBLa to LBLd in common. The amount of charges accumulated in the global bit line GBLb is added in common to the local bit lines LBLd to LBLf. In this way, the forming processing in the second embodiment can be performed with a larger current than that in the first embodiment. This enables the forming processing to be performed in a shorter time and with a reliability.

Other configurations and operations of the second embodiment may be identical to corresponding configurations and operations of the first embodiment. Therefore, the second embodiment can achieve effects identical to those of the first embodiment.

The timing when the selection circuits SEL1a to SEL1f connect the selected bit lines BL to the corresponding local bit lines LBLa to LBLf and the timing when the selection circuits SEL2a and SEL2b connect the local bit lines LBLa to LBLf to the corresponding global bit lines GBLa and GBLb can be either before or after the timing when the selection circuit SEL3a connects the global bit line GBLa or GBLb to the top global bit line TBLa. That is, the timing of connection of the selected bit lines BL, the local bit lines LBLa to LBLf, and the global bit lines GBLa and GBLb can be either before or after the timing when a precharge voltage is applied to the global bit lines GBLa and GBLb. Therefore, the selected bit lines BL, the local bit lines LBLa to LBLf, and the global bit lines GBLa and GBLb may be simultaneously precharged. Alternatively, the global bit lines GBLa and GBLb may be precharged first and then the local bit lines LBLa to LBLf and the selected bit lines BL may be precharged thereafter.

Further, after the selected bit lines BL, the local bit lines LBLa to LBLf, and the global bit lines GBLa and GBLb are precharged, the selection circuits SEL2a and SEL2b may disconnect the local bit lines LBLa to LBLf from the global bit lines GBLa and GBLb in the forming processing. This enables the column decoder CD in the second embodiment to perform identical forming processing to that in the first embodiment.

Third Embodiment

Figure 5:
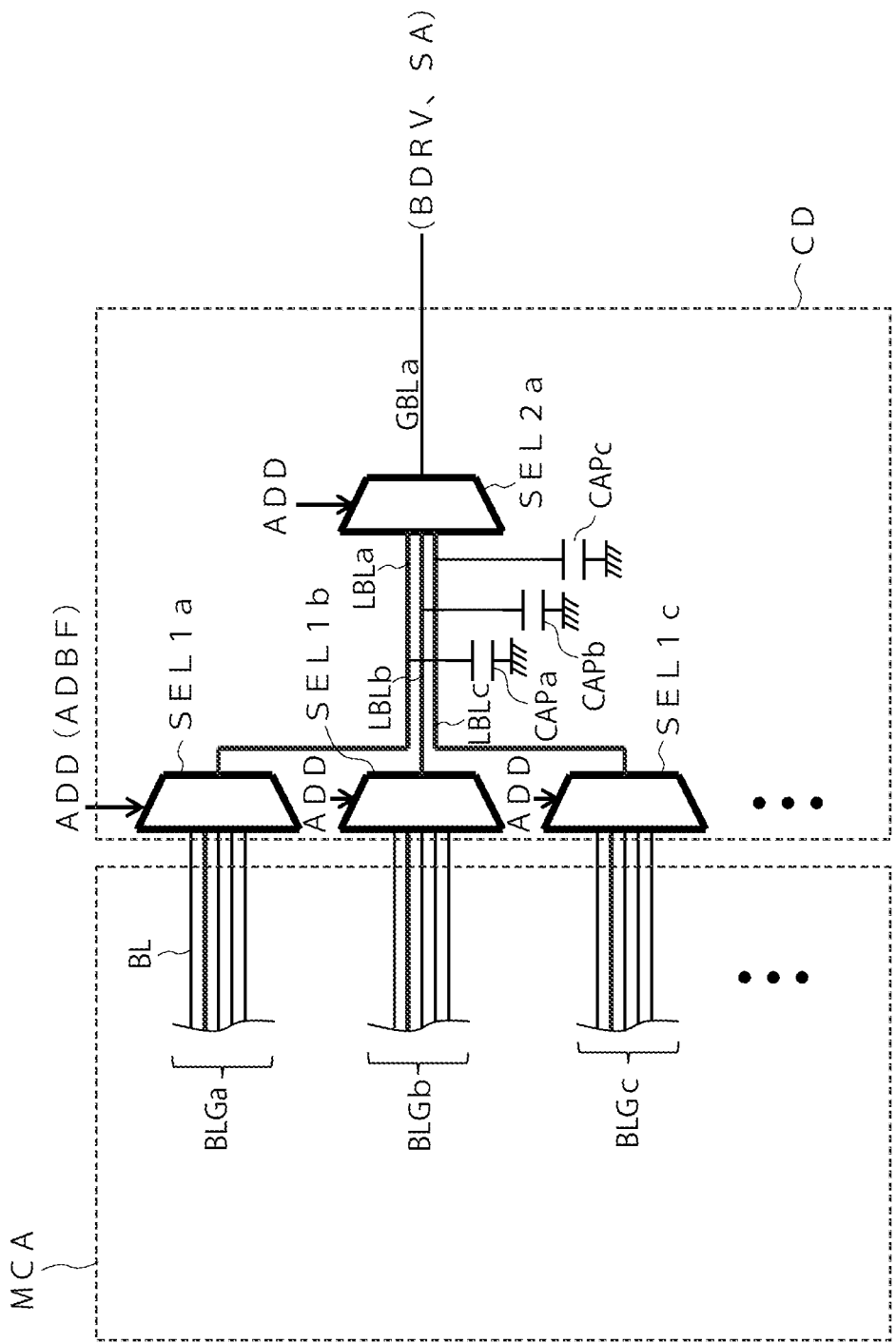
FIG. 5 is a block diagram illustrating a configuration example of a column decoder according to a third embodiment.

FIG. 5 is a block diagram illustrating a configuration example of a column decoder according to a third embodiment. The column decoder CD according to the third embodiment further includes a plurality of capacitor elements CAPa to CAPc respectively connected to the corresponding local bit lines LBLa to LBLc. The capacitor elements CAPa to CAPc are connected between the corresponding local bit lines LBLa to LBLc and the ground, respectively. The capacities of the capacitor elements CAPa to CAPc are set according to the current amount passed through the selected memory cells MC in the forming processing. Since the memory cells MC are often formed in a same configuration, the capacities of the capacitor elements CAPa to CAPc are preferably substantially equal to each other.

In the third embodiment, because the capacities of the capacitor elements CAPa to CAPc are respectively added to the local bit lines LBLa to LBLc, the current amount passed through the selected memory cells MC can be increased or adjusted in the forming processing. Other configurations of the third embodiment may be identical to those of the first embodiment. Therefore, the third embodiment can achieve effects identical to those of the first embodiment. Further, the third embodiment can be combined with the second embodiment. In this case, a capacitor element may be connected to each of the local bit lines LBLa to LBLf, and/or to each of the global bit lines GBLa and GBLb. A capacitance between lines or any of capacitances of terminals of a MOS transistor can be used as a capacitor element. The shape of terminals of transistors that are included in the selection circuits SEL1a, SEL1b, SEL1c, and SEL2a and that are connected to the local bit lines LBLa, LBLb, and LBLc may be enlarged relative to the shape of terminals of normal transistors to generate and use an additional capacitance.

Fourth Embodiment

Figure 6:
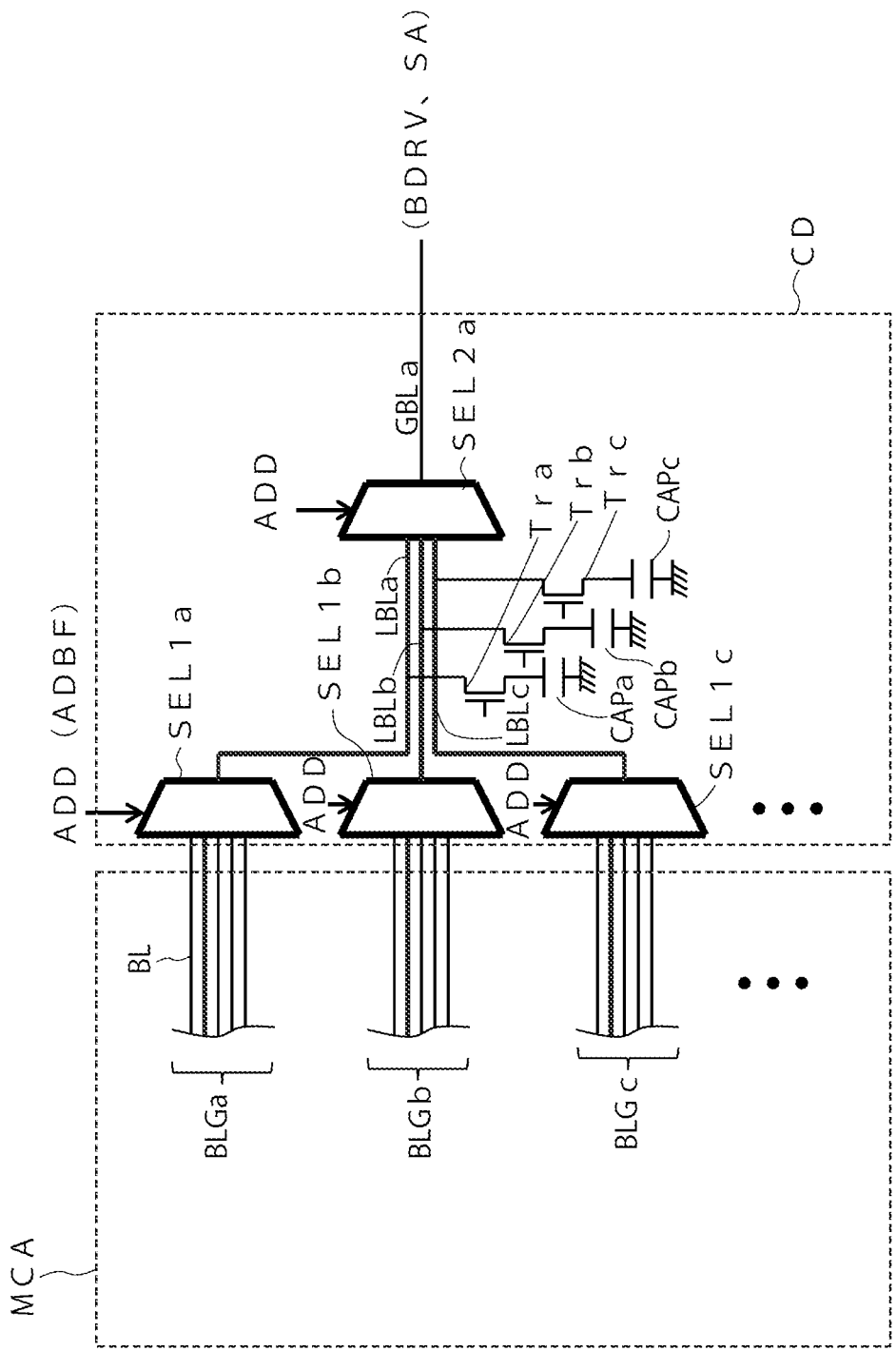
FIG. 6 is a block diagram illustrating a configuration example of a column decoder according to a fourth embodiment.

FIG. 6 is a block diagram illustrating a configuration example of a column decoder according to a fourth embodiment. The column decoder CD according to the fourth embodiment further includes transistors Tra to Trc connected between the local bit lines LBLa to LBLc and the capacitor elements CAPa to CAPc, respectively. That is, the transistors Tra to Trc and the capacitor elements CAPa to CAPc are connected in series between the local bit lines LBLa to LBLc and the ground, respectively. The transistors Tra to Trc functioning as switching elements correspond to the local bit lines LBLa to LBLc and electrically connect/disconnect the capacitor elements CAPa to CAPc to/from the local bit lines LBLa to LBLc, respectively. The transistors Tra to Trc can have a same configuration. The transistors Tra to Trc are controlled by a control signal from outside.

The capacitor elements CAPa to CAPc are not required in the normal operation while used in the forming processing. Therefore, the transistors Tra to Trc are brought to a conducting state in the forming processing to electrically connect the capacitor elements CAPa to CAPc to the local bit lines LBLa to LBLc, respectively. Meanwhile, in the normal operation such as a read operation or a write operation after the forming processing, the transistors Tra to Trc are brought to a non-conducting state to electrically disconnect the capacitor elements CAPa to CAPc from the local bit lines LBLa to LBLc, respectively.

With this switching operations of the transistors Tra to Trc, the capacitor elements CAPa to CAPc can be prevented from interrupting the normal operation while the forming processing is reliably performed.

Other configurations and operations of the fourth embodiment may be identical to corresponding configurations and operations of the first embodiment. Therefore, the fourth embodiment can achieve effects identical to those of the first embodiment. Further, the fourth embodiment can be combined with the second embodiment. In this case, capacitor elements and transistors can be connected to local bit lines and/or global bit lines between the bit lines BL and a top global bit line, respectively. For example, the capacitor elements and the transistors may be connected to the local bit lines LBLa to LBLf, respectively, and/or may be connected to the global bit lines GBLa and GBLb, respectively.

Fifth Embodiment

Figure 7:
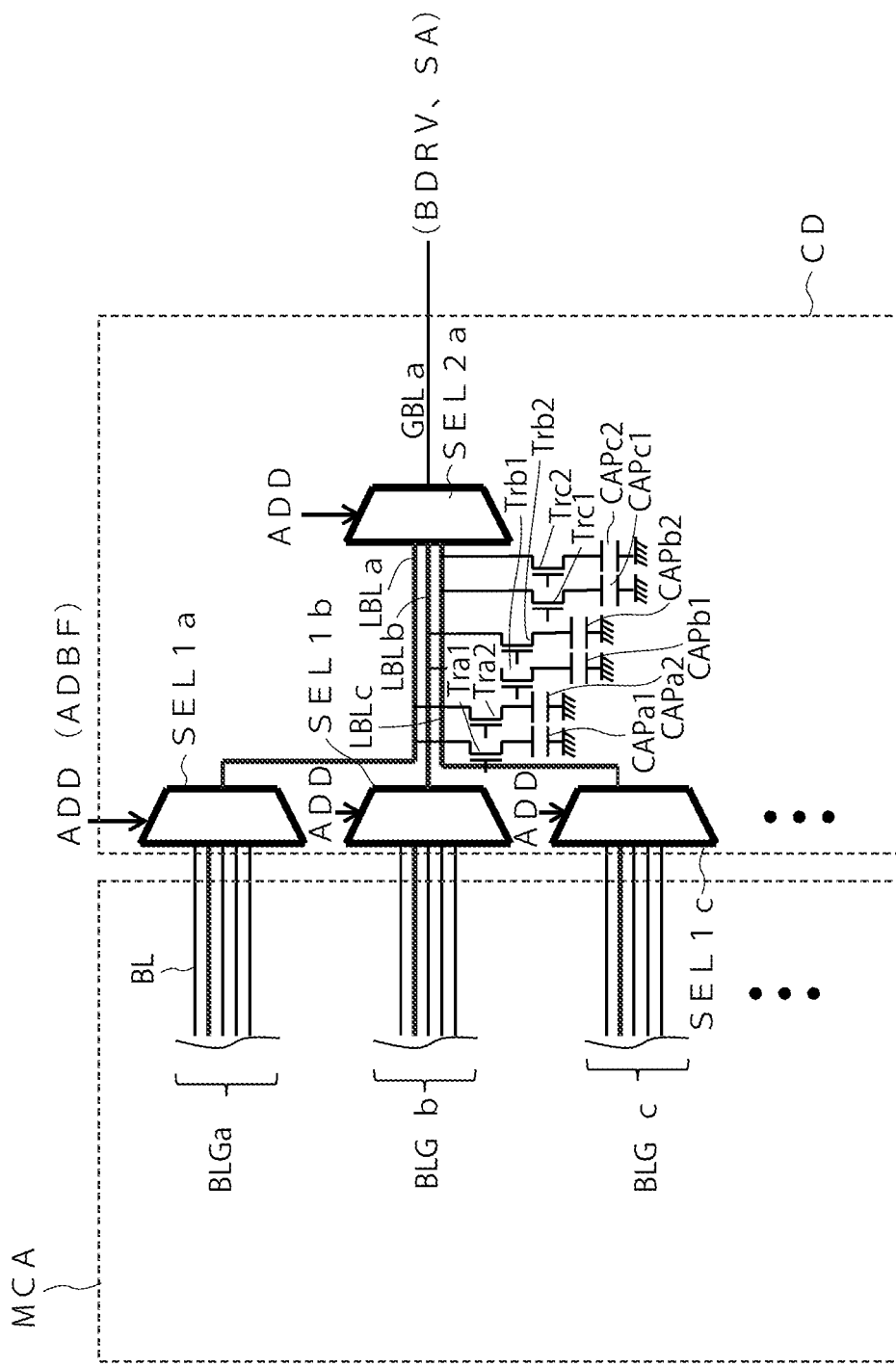
FIG. 7 is a block diagram illustrating a configuration example of a column decoder according to a fifth embodiment.

FIG. 7 is a block diagram illustrating a configuration example of a column decoder according to a fifth embodiment. According to the fifth embodiment, a plurality of capacitor elements CAPa1 and CAPa2 are connected to one local bit line LBLa, a plurality of capacitor elements CAPb1 and CAMPb2 are connected to one local bit line LBLb, and a plurality of capacitor elements CAPc1 and CAPc2 are connected to one local bit line LBLc. The capacitor elements CAPa1 and CAPa2 can have a same capacity or may have capacities different from each other. The capacitor elements CAPb1 and CAPb2 also can have a same capacity or may have capacities different from each other. The capacitor elements CAPc1 and CAPc2 also can have a same capacity or may have capacities different from each other.

Transistors Tra1 and Tra2 are connected between the local bit line LBLa and the capacitor elements CAPa1 and CAPa2, respectively. Transistors Trb1 and Trb2 are connected between the local bit line LBLb and the capacitor elements CAPb1 and CAPb2, respectively. Transistors Trc1 and Trc2 are connected between the local bit line LBLc and the capacitor elements CAPc1 and CAPc2, respectively.

That is, the transistor Tra1 and the capacitor element CAPa1 are connected in series between the local bit line LBLa and the ground. The transistor Tra2 and the capacitor element CAPa2 are connected in series between the local bit line LBLa and the ground. The transistor Trb1 and the capacitor element CAPb1 are connected in series between the local bit line LBLb and the ground. The transistor Trb2 and the capacitor element CAPb2 are connected in series between the local bit line LBLb and the ground. The transistor Trc1 and the capacitor element CAPc1 are connected in series between the local bit line LBLc and the ground. The transistor Trc2 and the capacitor element CAPc2 are connected in series between the local bit line LBLc and the ground.

The transistors Tra1 to Trc2 can electrically connect/disconnect the corresponding capacitor elements CAPa1 to CAPc2 to/from the corresponding local bit lines LBLa to LBLc, respectively. The transistors Tra1 to Trc2 can have a same configuration.

The capacitor elements CAPa1 to CAPc2 are not required in the normal operation while used in the forming processing. Therefore, the transistors Tra1 to Trc2 are brought to a conducting state in the forming processing to electrically connect the capacitor elements CAPa1 to CAPc2 to the corresponding local bit lines LBLa to LBLc, respectively. Meanwhile, in the normal operation such as a read operation or a write operation after the forming processing, the transistors Tra1 to Trc2 are brought to a non-conducting state to electrically disconnect the capacitor elements CAPa1 to CAPc2 from the corresponding local bit lines LBLa to LBLc, respectively.

With this switching operations of the transistors Tra1 to Trc2, it is possible to prevent the capacitor elements CAPa1 to CAPc2 from interrupting the normal operation while reliably performing the forming processing.

A plurality of capacitor elements and a plurality of transistors are provided for each of the local bit lines LBLa to LBLc. Therefore, currents passed through the memory cells MC in plural times of the forming processing can be set to be different from each other. For example, the transistors Tra1, Trb1, and Trc1 are brought to the conducting state and the transistors Tra2, Trb2, and Trc2 are brought to the non-conducting state in first forming processing. This enables the capacitor elements CAPa1, CAPb1, and CAPc1 to be connected to the local bit lines LBLa to LBLc, respectively, while the capacitor elements CAPa2, CAPb2, and CAPc2 are kept disconnected from the local bit lines LBLa to LBLc, respectively. The precharging and the forming are performed in this state. Next, the storage device 100 verifies whether the forming has been completed (a verification operation). In the verification operation, it suffices that predetermined data is written and read to verify whether the data has been correctly written in the memory cells MC. At this time, second forming processing is performed to selected memory cells MC to which the forming has not been completed. In the second forming processing, the transistors Tra1, Trb1, and Trc1 and also the transistors Tra2, Trb2, and Trc2 are brought to the conducting state. Accordingly, the capacitor elements CAPa1, CAPb1, and CAPc1 and the capacitor elements CAPa2, CAPb2, and CAPc2 are connected to the corresponding local bit lines LBLa to LBLc, respectively. The precharging and the forming are performed in this state. This enables the column decoder CD to perform the forming processing again with a larger capacity than that in the first forming processing. A larger current than that in the first forming processing flows in the memory cells MC in the second forming processing. As a result, the memory cells MC can be subjected to the forming more reliably.

It is not always necessary to use different capacitor elements in the first and second forming processing and same capacitor elements may be used. That is, substantially equal currents may be passed through the memory cells MC in the first and second forming processing.

The number of capacitor elements and the number of transistors connected to each of the local bit lines LBLa to LBLc are not limited to two and more capacitor elements and transistors or less capacitor elements and transistors may be connected. These capacitor elements and transistors can be used to adjust the capacity of each of the local bit lines LBLa to LBLc.

The second forming processing may be simultaneously performed in parallel to the first forming processing of a different memory cell array MCA that has not been subject to the forming yet. This leads to reduction in the time of the entire forming processing.

(First Adjustment of Forming Intensity)

The forming intensity indicates the current (the charge amount) passed through the selected memory cells MC in the forming processing. The current of the forming processing may be adjusted with an on-resistance of the transistors Tra1 to Trc2. For example, the on-resistance is adjusted by adjusting the gate voltages of the transistors Tra1 to Trc2 at the time of the forming processing. This enables the current supplied to the selected bit lines BL and the selected memory cells MC to be adjusted via the transistors Tra1 to Trc2.

The transistors Tra1 to Trc2 may be either N-type MOSFETs (Metal Oxide Semiconductor Field Effect Transistors) or P-type MOSFETs. A current can be easily supplied to the N-type MOSFETs even with a low voltage and a current can be easily supplied to the P-type MOSFETs with a high voltage. As described above, the transistors Tra1 to Tra2 can be transistors having freely-selected conductivity type, size, and the like. Further, the capacities of the capacitor elements CAPa1 to CAPc2 may also be freely set. This enables the current (that is, the forming intensity) of the forming processing to be more finely set.

The capacities of capacitor elements connected to a same local bit line may be changed by factors of two. For example, the capacities of capacitor elements connected to a same local bit line may be C (C is a certain unit capacity), $2C, 2^2C, 2^3C, \ldots$ . This widens the adjustment range of the capacities of the local bit lines and enables a fine adjustment. As a result, the forming intensity can be more finely set.

(Second Adjustment of Forming Intensity)

Figure 8A:
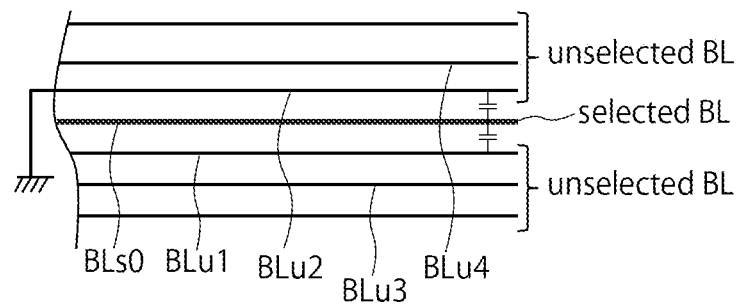
FIG. 8A is a diagram illustrating an adjustment method of forming intensity.
Figure 8B:
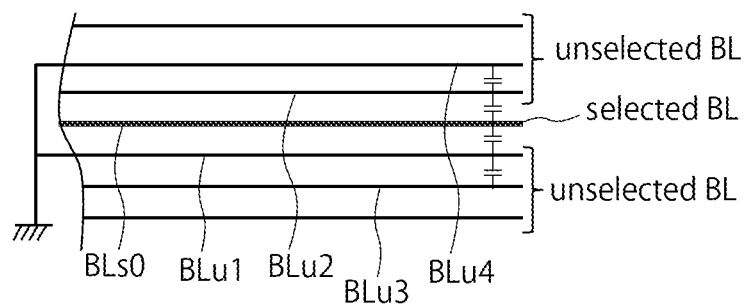
FIG. 8B is a diagram illustrating the adjustment method of forming intensity.

FIGS. 8A and 8B are diagrams illustrating an adjustment method of the forming intensity. In a case in which unselected bit lines BLu1 and BLu2 adjacent to a selected bit line BLs0 are electrically grounded as illustrated in FIG. 8A, the capacities of the unselected bit lines BLu1 and BLu2 have an impact on the selected bit line BLs0 and the capacity of the selected bit line BLs0 appears to be larger. Therefore, the forming intensity is increased.

In a case in which the unselected bit lines BLu1 and BLu2 adjacent to the selected bit line BLs0 are in an electrically floating state as illustrated in FIG. 8B, only the capacities of bit lines connected in series from the selected bit line BLs0 to grounded unselected bit lines BLu3 and BLu4 are affected. Therefore, the capacity of the selected bit line BLs0 appears to be smaller and the forming intensity is decreased. In this way, the forming intensity can be adjusted by changing the electrical state (the grounded state or the floating state) of unselected bit lines in the vicinity of the selected bit line BLs0.

Sixth Embodiment

Figure 9:
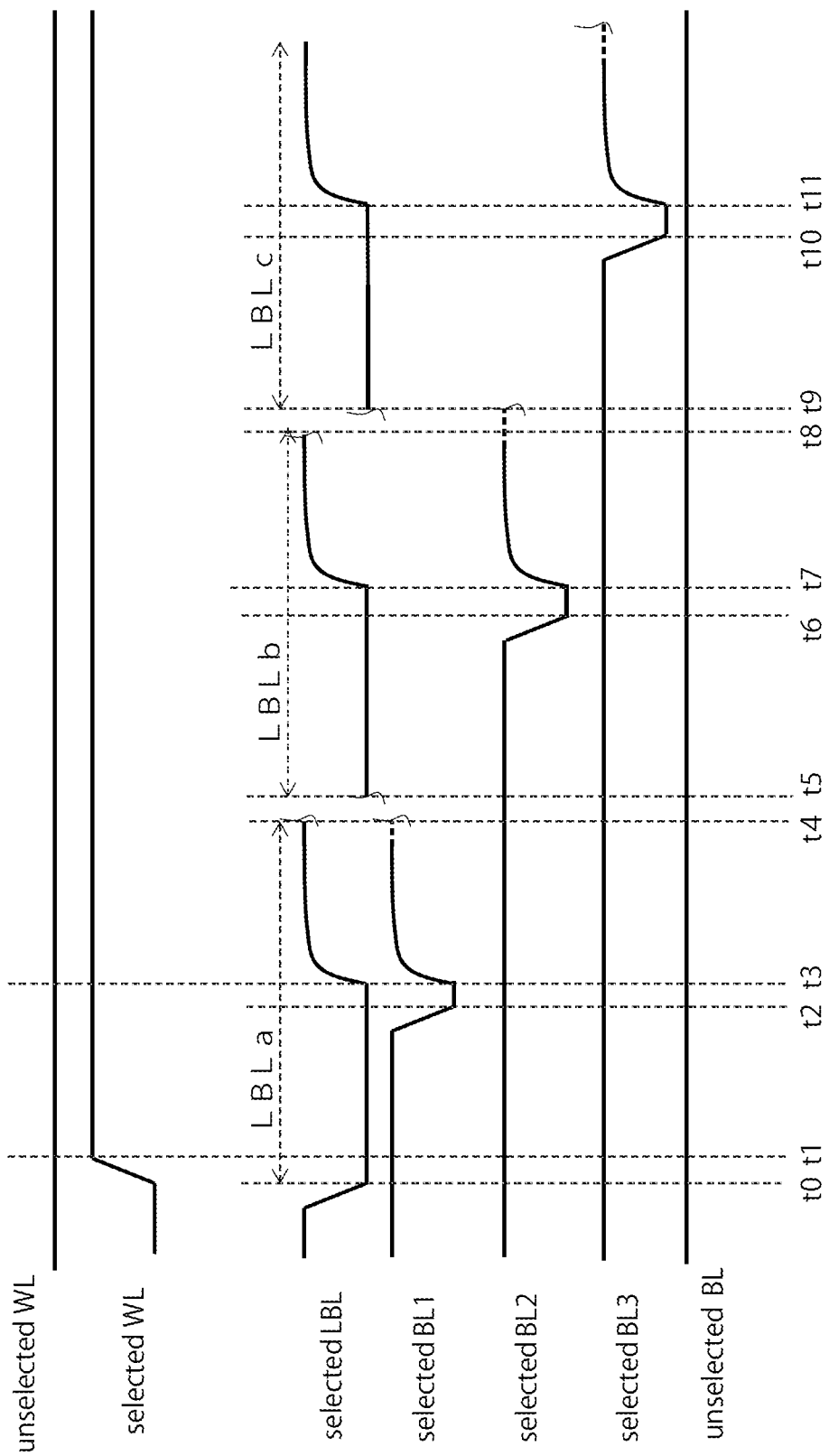
FIG. 9 is a timing chart illustrating an example of the forming processing according to a sixth embodiment.

FIG. 9 is a timing chart illustrating an example of the forming processing according to the sixth embodiment. In the sixth embodiment, the storage device 100 serially performs the forming processing of selected memory cells MC connected to a plurality of bit lines BL1 to BL3 while keeping the selected word line WL raised. The forming processing according to the sixth embodiment is explained, for example, with reference to FIGS. 2 and 9.

For example, at a time t0, the selection circuit SEL2a in FIG. 2 connects the global bit line GBLa to the local bit line LBLa to precharge the local bit line LBLa. At a time t1, the word line driver WDRV causes the selected word line WL to rise. At this time, the selection circuits SEL1a to SEL1c do not connect the local bit lines LBLa to LBLc to the selected bit lines BL of the corresponding groups BLGa to BLGc, respectively. Therefore, while the local bit line LBLa is precharged, the selected bit lines BL are not precharged. The selection circuit SEL2a disconnects the local bit line LBLa from the global bit line GBLa in the state where the local bit line LBLa is precharged, thereby to bring the local bit line LBLa to the electrically floating state.

Next, at a time t2, the selection circuit SEL1a connects the local bit line LBLa to the selected bit line BL1 of the group BLGa. Accordingly, charges accumulated in the local bit line LBLa are supplied to the selected bit line BL1 selected from the group BLGa. Therefore, the voltage of the selected bit line BL1 temporarily falls due to the charges (for example, electrons) from the local bit lines LBLa. Unselected bit lines are kept disconnected from the local bit lines LBLa to LBLc and maintain the high level state.

Since the selected word line WL has already risen at that time, the charges accumulated in the local bit line LBLa are supplied to the selected bit line BL1 and selected memory cells MC connected to the selected bit line BL1 at a time t3 immediately after the time t2. Therefore, a current flows in the resistance elements R of the selected memory cells MC, whereby the voltages of the selected bit line BL1 and the local bit line LBLa gradually increase. Accordingly, forming of the selected memory cells MC connected to the selected bit line BL1 is performed.

Next, the selection circuit SEL1a electrically disconnects the selected bit line BL1 from the local bit line LBLa at a time t4 while the selected word line WL is kept raised.

Next, at a time t5, the selection circuit SEL2a connects the global bit line GBLa to the local bit line LBLb to precharge the local bit line LBLb. The selection circuit SEL2a disconnects the local bit line LBLb from the global bit line GBLa in the state where the local bit line LBLb has been precharged, thereby bringing the local bit line LBLb to the electrically floating state.

Next, at a time t6, the selection circuit SEL1b connects the local bit line LBLb to the selected bit line BL2 of the group BLGb. Accordingly, charges accumulated in the local bit line LBLb are supplied to the selected bit line BL2 selected from the group BLGb. Therefore, the voltage of the selected bit line BL2 temporarily falls due to the charges (for example, electrons) from the local bit line LBLb.

Since the selected word line WL has already risen at that time, the charges accumulated in the local bit line LBLb are supplied to selected memory cells MC connected to the selected bit line BL2 at a time t7 immediately after the time t6. Due to a current flowing in the resistance elements R of the selected memory cells MC, the voltages of the selected bit line BL2 and the local bit line LBLb gradually increase. Accordingly, forming of the selected memory cells MC connected to the selected bit line BL2 is performed.

Next, the selection circuit SEL1b electrically disconnects the selected bit line BL2 from the local bit line LBLb at a time t8 while the selected word line WL is kept raised.

Next, at a time t9, the selection circuit SEL2a connects the global bit line GBLa to the local bit line LBLc to precharge the local bit line LBLc. The selection circuit SEL2a disconnects the local bit line LBLc from the global bit line GBLa in the state where the local bit line LBLc has been precharged, thereby bringing the local bit line LBLc to the electrically floating state.

Next, at a time t10, the selection circuit SEL1c connects the local bit line LBLc to the selected bit line BL3 of the group BLGc. Accordingly, charges accumulated in the local bit line LBLc are supplied to the selected bit line BL3 selected from the group BLGc. Therefore, the voltage of the selected bit line BL3 temporarily falls due to the charges (for example, electrons) from the local bit line LBLc.

Since the selected word line WL has already risen at that time, the charges accumulated in the local bit line LBLc are supplied to selected memory cells MC connected to the selected bit line BL3 at a time t11 immediately after the time t10. Due to a current flowing in the resistance elements R of the selected memory cells MC, the voltages of the selected bit line BL3 and the local bit line LBLc gradually increase. Accordingly, forming of the selected memory cells MC connected to the selected bit line BL3 is performed.

Thereafter, the selection circuit SEL1c electrically disconnects the selected bit line BL3 from the local bit line LBLc while the selected word line WL is kept raised. The forming processing of other memory cells MC can be performed in the same manner while the selected word line WL is kept raised.

The times (t2 to t3, t6 to t7, and t10 to t11) of the forming processing of the selected memory cells MC1 to MC3 sometimes differ according to the states of the selected memory cells MC1 to MC3.

In this way, the storage device 100 can serially perform the forming processing of selected memory cells MC connected to a plurality of bit lines BL while the selected word line WL is kept raised. The number of bit lines BL to be serially subjected to the forming processing is not limited to three and may be more or less. This eliminates the time required to cause a selected word line WL to rise and shortens the time of the forming processing.

In the sixth embodiment, charges are redistributed between the local bit lines LBLa to LBLc and the selected bit lines BL1 to BL3, respectively. Therefore, the voltage with which the local bit lines LBLa to LBLc have been precharged and the voltage to be applied to the selected memory cells MC via the selected bit lines BL1 to BL3 are slightly different from each other. However, because each of the capacities of the local bit lines LBLa to LBLc are generally sufficiently larger than the capacities of the selected bit lines BL1 to BL3, the voltage difference between the precharge voltage and the voltage to be applied to the selected memory cells MC is sufficiently small.

The sixth embodiment may be applied to any of the second to fifth embodiments. For example, the forming processing of the selected memory cells MC may be performed using charges with which the local bit lines LBLa to LBLc and the global bit line GBLa have been precharged. Alternatively, the forming processing of the selected memory cells MC may be performed using charges with which the local bit lines LBLa to LBLc and the capacitor elements CAPa to CAPc have been precharged. In this case, the effect of any of the second to fourth embodiments can also be obtained in the sixth embodiment. Since the capacity of the global bit line GBLa and/or the capacities of the capacitor elements CAPa to CAPc are added to the capacities of the local bit lines LBLa to LBLc, the voltage difference between the precharge voltage and the voltage to be applied to the selected memory cells MC becomes smaller and does not cause any problem.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of first lines;
a plurality of second lines;
a plurality of memory cells respectively connected between the first lines and the second lines;
a plurality of third lines provided to respectively correspond to groups each comprising m (m≥2) lines of the first lines;
a first selection circuit configured to select a certain one of the first lines from each of the groups and to connect the selected first lines to the third lines corresponding to the groups, respectively;
at least one fourth line provided to correspond to the third lines;
a second selection circuit configured to select a certain one of the third lines and to connect the fourth line to the selected third line;
a third selection circuit configured to select a certain one of the second lines;
a first driver configured to apply a voltage to the fourth line; and
a second driver connected to the third selection circuit, wherein
the first driver charges the third line corresponding to the first line selected from at least one of the groups via the fourth line,
the first and second selection circuits bring the selected first line and the third line corresponding the first line to an electrically floating state, and
the second driver applies a voltage to the selected second line.

2. The device of claim 1, wherein
the first selection circuit connects the first lines and the third lines corresponding to the first lines to each other, and
the second selection circuit disconnects the fourth line from the third lines.

3. The device of claim 1, wherein
the first driver charges plural ones of the first lines selected from plural ones of the groups via the third lines respectively corresponding to the selected first lines, and the first and second selection circuits bring the selected first lines and the third lines corresponding to the first lines to an electrically floating state.

4. The device of claim 1, wherein
the first driver charges the first line selected from at least one of the groups via the third and fourth lines,
the first and second selection circuits bring the first line and the third and fourth lines corresponding to the first line to an electrically floating state while the first line and the third and fourth lines are kept connected to each other, and
the second driver applies the voltage to the selected second line.

5. The device of claim 1, further comprising a plurality of first capacitor elements connected to correspond to the third lines, respectively.

6. The device of claim 5, further comprising a plurality of first switching elements connected between the third lines and the first capacitor elements, respectively.

7. The device of claim 6, wherein the first switching elements electrically disconnect the corresponding first capacitor elements from the corresponding third lines, respectively, in a read or write operation.

8. The device of claim 6, wherein the first switching elements electrically connect the corresponding first capacitor elements to the corresponding third lines, respectively.

9. The device of claim 5, further comprising a plurality of second capacitor elements connected to correspond to the third lines, respectively, and having different capacities from those of the first capacitor elements.

10. The device of claim 9, further comprising a plurality of second switching elements connected between the third lines and the second capacitor elements, respectively.

11. The device of claim 10, wherein the second switching elements electrically disconnect the corresponding second capacitor elements from the corresponding third lines, respectively, in a read or write operation.

12. The device of claim 10, wherein the second switching elements electrically connect the corresponding second capacitor elements to the corresponding third lines, respectively.

13. The device of claim 3, wherein number of the first lines and number of the third lines are equal, the first lines and the third lines being connected in an electrically floating state.

14. The device of claim 3, wherein the first lines selected by the first selection circuit are not adjacent to each other.

15. The device of claim 1, wherein
the first selection circuit changes the first lines and the third lines to be connected to each other while the second driver applies the voltage to the selected second line, and
the second selection circuit connects the third lines to the fourth line to charge the third lines each time the first lines and the third lines to be connected to each other are changed.

16. The device of claim 1, wherein each of the memory cells is a phase-change memory.

17. A semiconductor storage device comprising:
a plurality of first lines;
a plurality of second lines;
a plurality of memory cells respectively connected between the first lines and the second lines;
a plurality of third lines provided to respectively correspond to groups each comprising m (m≥2) lines of the first lines;

a first selection circuit configured to select a certain one of the first lines from each of the groups and to connect the selected first lines to the third lines corresponding to the groups, respectively;

at least one fourth line provided to correspond to the third lines;

a second selection circuit configured to select a certain one of the third lines and to connect the fourth line to the selected third line;

a third selection circuit configured to select a certain one of the second lines;

a first driver configured to apply a voltage to the fourth line;

a second driver connected to the third selection circuit; and a plurality of first capacitor elements connected to correspond to the third lines, respectively.

18. The device of claim 17, further comprising a plurality of first switching elements connected between the third lines and the first capacitor elements, respectively.

19. The device of claim 18, wherein the first switching elements electrically disconnect the corresponding first capacitor elements from the corresponding third lines, respectively, in a read or write operation.

20. The device of claim 18, wherein the first switching elements electrically connect the corresponding first capacitor elements to the corresponding third lines, respectively.

21. The device of claim 17, further comprising a plurality of second capacitor elements connected to correspond to the third lines, respectively, and having different capacities from those of the first capacitor elements.

22. The device of claim 21, further comprising a plurality of second switching elements connected between the third lines and the second capacitor elements, respectively.

23. The device of claim 22, wherein the second switching elements electrically disconnect the corresponding second capacitor elements from the corresponding third lines, respectively, in a read or write operation.

24. The device of claim 22, wherein the second switching elements electrically connect the corresponding second capacitor elements to the corresponding third lines, respectively.

* * * * *